US 6,750,949 B2

(12) United States Patent
Loopstra et al.

(10) Patent No.: US 6,750,949 B2
(45) Date of Patent: Jun. 15, 2004

(54) LITHOGRAPHIC APPARATUS AND DEVICE MANUFACTURING METHOD

(75) Inventors: Erik Roelof Loopstra, Heeze (NL); Dominicus Jacobus Petrus Adrianus Franken, Veldhoven (NL); Josephus Jacobus Smits, Geldrop (NL); Antonius Johannes Josephus Van Dijsseldonk, Hapert (NL); Johannes Hubertus Josephina Moors, Helmond (NL); Albrecht Hof, Aalen (DE); Günter Maul, Aalen (DE); Michael Mühlbeyer, Aalen (DE); Klaus Mehlkopp, Alsdorf (DE)

(73) Assignee: AMSL Netherlands B.V., Veldhoven (NL)

( * ) Notice: Subject to any disclaimer, the term of this patent is extended or adjusted under 35 U.S.C. 154(b) by 0 days.

(21) Appl. No.: 10/193,688

(22) Filed: Jul. 12, 2002

(65) Prior Publication Data

US 2003/0058422 A1 Mar. 27, 2003

(30) Foreign Application Priority Data

Jul. 14, 2001 (DE) .......................................... 101 34 387

(51) Int. Cl.[7] ........................ G03B 27/42; G03B 27/54; G03B 7/02
(52) U.S. Cl. ............................ 355/53; 355/67; 359/820
(58) Field of Search ............................... 355/30, 53, 55, 355/67–71; 359/819–820, 826

(56) References Cited

U.S. PATENT DOCUMENTS

| | | | | |
|---|---|---|---|---|
| 6,118,599 A | * | 9/2000 | Spinali | ........................ 359/820 |
| 6,188,150 B1 | | 2/2001 | Spence | |
| 6,426,790 B1 | * | 7/2002 | Hayashi | ........................ 355/72 |
| 6,485,153 B2 | * | 11/2002 | Ota | ............................. 359/859 |
| 6,525,802 B1 | * | 2/2003 | Novak | .......................... 355/53 |
| 2002/0017616 A1 | | 2/2002 | Ota | |

FOREIGN PATENT DOCUMENTS

JP 11-345761 12/1999

OTHER PUBLICATIONS

A copy of the European Search Report dated Dec. 19, 2003.

* cited by examiner

Primary Examiner—Henry Hung Nguyen
(74) Attorney, Agent, or Firm—Pillsbury Winthrop, LLP

(57) ABSTRACT

A lithographic projection apparatus according to one embodiment of the invention includes a projection system having a plurality of optical elements or sensors mounted on a frame. The frame includes support portions made of a material (e.g. a glass ceramic) having a coefficient of thermal expansion of less than or approximately equal to $0.1 \times 10^{-6}$ $K^{-1}$.

28 Claims, 2 Drawing Sheets

LITHOGRAPHIC APPARATUS AND DEVICE MANUFACTURING METHOD

This application claims priority to German Patent Application DE 101 34 387.6 filed Jul. 14, 2001, which document is herein incorporated by reference.

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. Generally, such a pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and No. 5,523,193, which are incorporated herein by reference, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single wafer will contain a whole network of adjacent target portions that are successively irradiated via the projection system (e.g. one at a time). Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The term "projection system" should be broadly interpreted as encompassing various types of projection system, including refractive optics, reflective optics, and catadioptric systems, for example. For the sake of simplicity, the projection system may hereinafter be referred to as the "lens". The radiation system may also include components operating according to any of these design types for directing, shaping, reducing, enlarging, patterning, and/or otherwise controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin-stage lithographic apparatus are described, for example, in U.S. Pat. No. 5,969,441 and PCT Application No. WO 98/40791, which documents are incorporated herein by reference.

The projection system of a lithographic projection apparatus which uses a beam of ultra-violet radiation with a wavelength of, for example, 248 nm (nanometers), typically comprises a plurality of refractive optical elements mounted to a frame. The refractive optical elements must be positioned accurately relative to the beam and to one another and must be isolated from vibrations of the base member. These conditions can be met by making the frame to which the optical elements are mounted of Invar™, a cobalt-containing steel that has a Young's Modulus, E, of about 140 GPa (gigapascals ($10^9$ Pa), where one pascal is defined as one newton per square meter ($N/m^2$)).

One advantage of Invar™ is that it is easy to machine into the relatively complicated shapes required of the frame of the projection system. Also, as a metal, Invar™ can easily be manufactured in separate parts and joined together by welding or other techniques used for joining metals. The high Young's Modulus, E, of Invar™ means that a frame which has a high mechanical stiffness to prevent mechanical vibrations being transmitted to the optical elements can easily be designed. A further advantage of Invar™ over, for example, stainless steel (which has also been used) is that Invar™ has a relatively low coefficient of thermal expansion thereby resulting in a projection system for a lithographic projection apparatus which is temperature-stable. The coefficient of thermal expansion of Invar™ is about $1 \times 10^{-6}$ $K^{-1}$, which is about the lowest of any known metal.

To meet the ever-present demand for imaging features of reduced size, it is desirable to reduce the wavelength of radiation used for the projection beam. Thus, a desire for improved resolution has fostered the development of lithographic projection apparatus making use of extreme ultra-violet radiation (EUV) (i.e. with a wavelength in the range of 5–20 nm). Because no material suitable for forming refractive optical elements for EUV is known, current EUV lithography apparatus use mirrors in the projection system. Additionally, the beam is kept in vacuum to avoid contamination and attenuation of the beam. The positioning requirements of the optical elements of EUV lithography apparatus are considerably more stringent than those of ultra-violet lithography apparatus because of: (a) use of a smaller wavelength of radiation, (b) use of reflective rather than refractive optical elements, and (c) the increased resolution, i.e. the smaller size of the features to be imaged. Under these circumstances, the required positioning accuracy increases to the order of 10 nm or so.

Unfortunately, with the increased positioning accuracy required in EUV lithography apparatus, it has been found that a frame made of Invar™ either requires cooling to maintain the position of the optical elements within the desired positional accuracy or requires predictive temperature-compensating positioning control, which is complicated and expensive. It is desirable, for example, to provide a high degree of positional accuracy with a reduced need for temperature control and/or compensation.

SUMMARY

Embodiments of the invention include a projection system which meets the requirements for EUV lithography apparatus. For example, a lithographic apparatus according to one such embodiment of the invention includes a frame that includes support portions made of a material having a coefficient of thermal expansion that is less than or approximately equal to $0.1 \times 10^{-6}$ $K^{-1}$.

A device manufacturing method according to another embodiment of the invention includes using a plurality of optical elements to project a beam of radiation onto a target portion of a layer of radiation-sensitive material and measuring a position of at least one of the optical elements using a set of (i.e. one or more) sensors. The sensors and/or the optical elements are mounted on a frame having support portions made of a material having a coefficient of thermal expansion of less than or approximately equal to $0.1 \times 10^{-6} K^{-1}$.

Although specific reference may be made in this text to the use of an apparatus according to an embodiment of the invention in the manufacture of ICs, it should be explicitly understood that such an apparatus may have many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet (EUV) radiation (e.g. having a wavelength in the range 5–20 nm, especially around 13 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
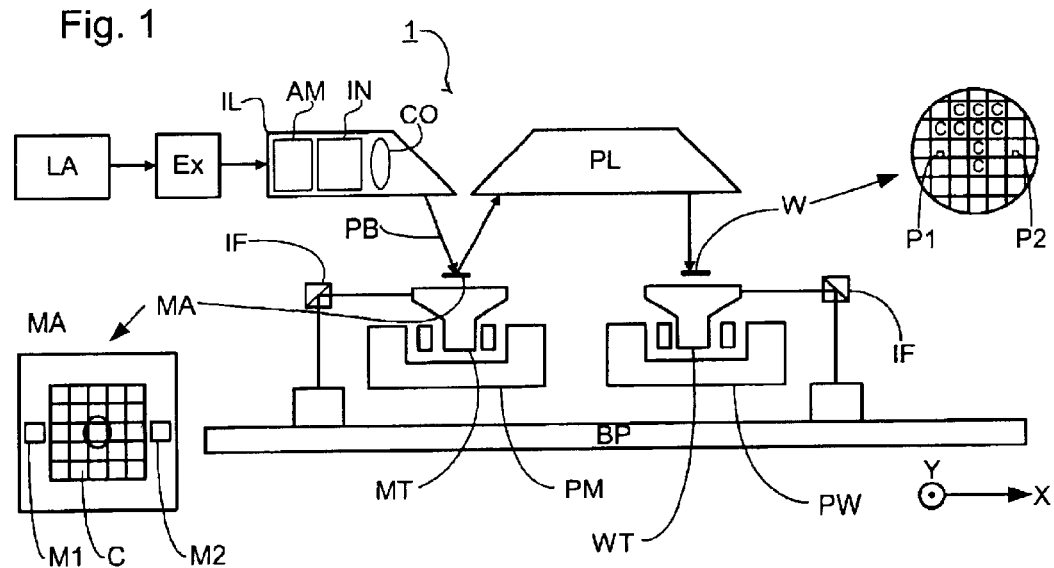
FIG. 1 depicts a lithographic projection apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation. In this particular example, the radiation system Ex, IL, for supplying a projection beam PB of radiation (e.g. UV or EUV radiation) also comprises a radiation source LA;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated silicon wafer), and is connected to a second positioning structure for accurately positioning the substrate with respect to item PL; and A projection system ("lens") configured to project the patterned beam. In this example, projection system PL (e.g. a mirror system) is configured to image an irradiated portion of the mask MA onto a target portion C (e.g. comprising one or more dies) of the substrate W using a plurality of optical elements (e.g. mirrors). In another example, the lens may include a reflective, a refractive or a catadioptric lens design.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a mercury lamp, an excimer laser, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having been selectively reflected by (alternatively, having traversed) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Previously (i.e. for lithographic projection apparatus using wavelengths of 248 or 193 nm) the frame that holds the optical elements of lens PL has been made of metal which is easily machined and can be assembled by welding. Stainless steel and more recently Invar™ have been used, Invar™ being particularly suitable because of its high stiffness and low (for a metal) coefficient of thermal expansion. However, it has been found that the thermal stability requirements of an EUV lithography apparatus cannot be met with such a frame without either thermal cooling or predictive temperature control.

Figure 2:
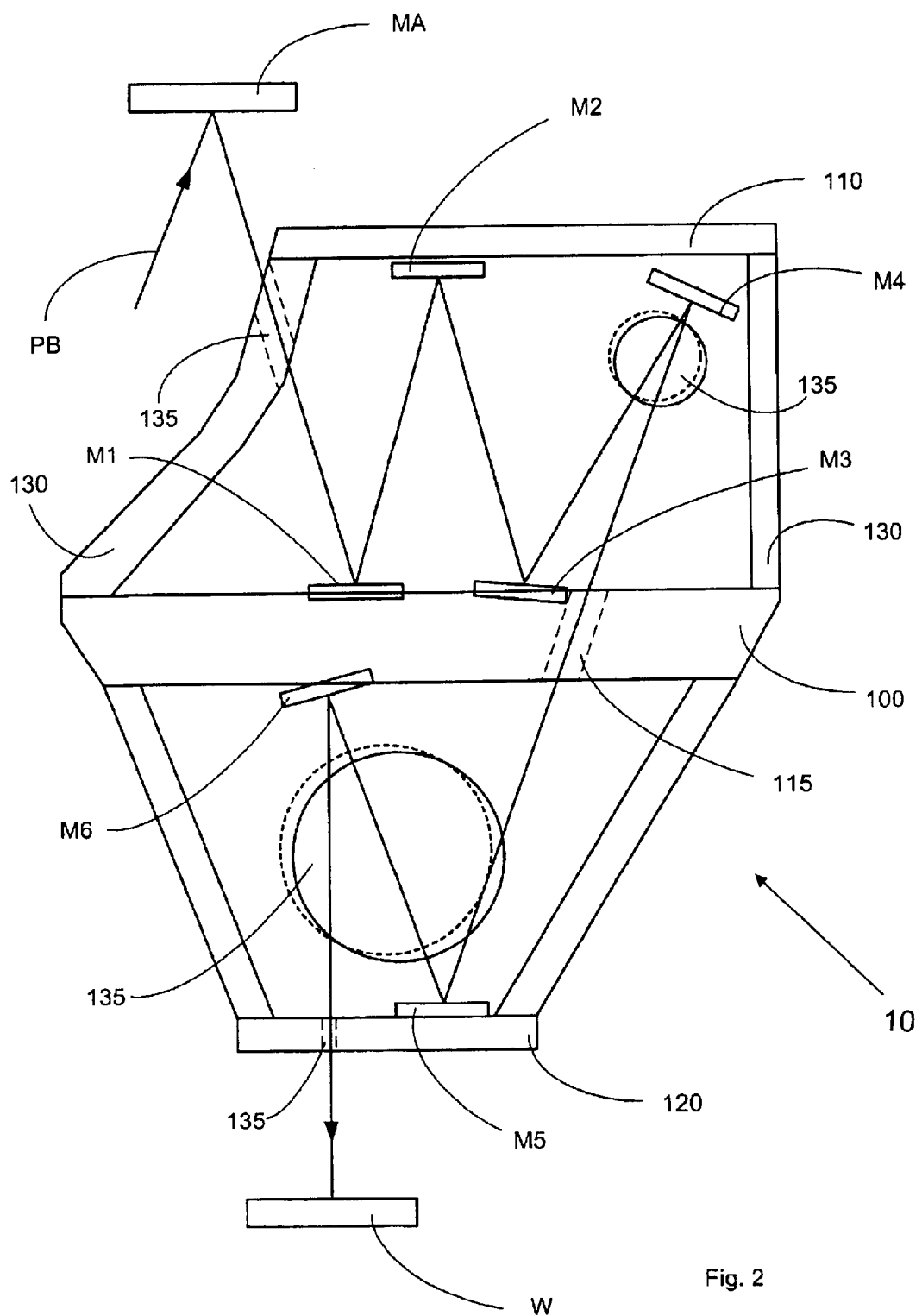
FIG. 2 is a cross-sectional view of a frame of the projection system of a lithographic projection apparatus according to an embodiment of the invention.

A frame according to one embodiment of the invention is made of a glass ceramic material having a coefficient of thermal expansion of less than $0.1 \times 10^{-6}$ $K^{-1}$. More preferably, the material of the frame (for example, a frame as illustrated in FIG. 2) has a coefficient of thermal expansion of less than $0.05 \times 10^{-6}$ or $0.02 \times 10^{-6}$ $K^{-1}$. Unfortunately, there are no presently known metals with a coefficient of thermal expansion in this range with the required stiffness.

The term "glass ceramic" is a term used in the field to describe a material which is a combination of a glass and a ceramic but which is neither a glass nor a ceramic. Specifically, a glass ceramic material has a partially or even totally crystallized structure (as opposed to the essentially amorphous structure of a glass). Such crystallization may be promoted during manufacture of the glass ceramic material by seeding a glass precursor with nuclei (e.g. via precipitation of a nucleating agent).

Traditionally, glass ceramic materials have been seen as unsuitable for use as structural elements in a lithography apparatus: partly because of the difficulty in machining and joining them as compared to metals, and partly because of their lower stiffness as compared to metals. Additionally, glass ceramic materials are typically brittle and expensive and have low resistance to shock. However, the inventors have discovered that careful design allows such materials to be used, despite a Young's Modulus (E) that may be somewhat lower than that of stainless steel, Invar™ or other metals which have previously been used for structural elements in lithography apparatus.

In some applications, further surprising advantages may be achieved by using glass ceramics. For example, at least some of these materials have a large emission coefficient for electromagnetic radiation in the infrared range: up to a factor of 5–10 or more times larger than that of stainless steel or Invar™. This property may allow a structure made of such materials to adapt more easily to the surrounding temperature in a vacuum (e.g. as in an EUV apparatus). Thus, the temperature of a frame according to an embodiment of the present invention may be more easily controlled if such control is found to be necessary (for instance, if the sensing means on the frame are temperature-sensitive). Another possible advantage is a better vacuum compatibility than metals, as glass ceramics do not tend to absorb molecules on their surface as metals may. These absorbed molecules can be detrimental to a vacuum when they de-absorb.

In order for the frame to resist unwanted vibrations, it is desirable for the frame to be stiff. Theoretically, the required stiffness of the frame can be achieved by many materials simply by making the individual members of the frame thicker. However, it may be preferable to build the frame using a material that has a high Young's Modulus (E) and a low density, as such a frame may be made both lighter and less bulky.

Preferably the selected material or materials has a Young's Modulus (E) of at least 60 GPa. With such a material, a frame can be built which does not suffer from parasitic vibrations typically present in a lithography apparatus by careful design. Materials from which the frame may be built to the design requirements include ULE™ glass (manufactured by Corning Incorporated, 1 River Front Plaza, Corning, N.Y. 14831), Zerodur™ (manufactured by Schott Glass, Hattenbergstrasse 10 55120, Mainz, Germany) and Low CTE Cordierite™ (manufactured by Kyocera Corporation, 6 Takeda Tobadono-cho, Fushimi-ku, Kyoto 612-8501 Japan). Clearceram-Z™ (manufactured by Ohara group, Ashigara Optical Inc., 4292 Yoshidajima Ashigara Kami Gun, Kanagawa, 228-0021, Japan) and the Russian glass ceramic Astrosital™ are variants of Zerodur™ and may also be used.

It has been found that glass ceramic materials having a low coefficient of thermal expansion are best suited to a frame according to an embodiment of the invention such as frame 10 (as shown in FIG. 2). Examples of such glass ceramics are ULE™, Zerodur™, Cordierite™, Clearceram-Z™ or Astrosital™ (also known as Sitall, Sitall CO-115M and Astrositall). The mechanical properties of those materials in comparison to mechanical properties of stainless steel and Invar™ are given in Table 1:

ULE™ is a titanium silicate glass ceramic manufactured by flame hydrolysis. The material is based on $SiO_2$ with $TiO_2$ present in a quantity of about 7 wt %. Other low expansion glasses, including Zerodur™, are based on $SiO_2$ and at least one alkaline metal oxide such as $Na_2O$, $Li_2O$ or $K_2O$. Cordierite is based on MgO, $Al_2O_3$ and $SiO_2$.

As can be seen from Table 1, suitable materials for the frame include glass ceramic materials which have a Young's Modulus (E) of at least 60 GPa. Some ceramics also exist that meet these requirements and may be used in a frame according to an embodiment of the invention.

In a configuration according to one embodiment of the invention, the frame includes a set of (i.e. one or more) support portions that support the optical elements of the projection system. In one example, the frame includes a first support portion in the form of a plate (i.e. being long and wide as compared to its thickness) and at least one further support portion in the form of a plate, said plates being in spaced apart relationship and arranged such that surfaces of said plates face each other. The at least one further plate is attached to the first plate by stiffener elements that substantially prevent flexing vibration of the plates. Such a construction is advantageous as the assembly of such a frame from a glass ceramic material with a coefficient of thermal expansion of less than $0.1 \times 10^{-6}$ $K^{-1}$ requires relatively few joints between members of the frame. One problem of using plates (namely, their susceptibility to flexing vibration) may be overcome by the use of stiffener elements between the plates. Preferably the stiffener elements are provided between the edges of the plates but in any case at the corners. Preferably the optical elements are attached to the plates but may also be attached, e.g., to one or more of the stiffener elements and/or other portions of the frame.

The frame 10 may be constructed in any suitable way. In one embodiment as shown in FIG. 2, the frame 10 is made of three generally parallel plates including a central first plate 100 and two further plates 110, 120 which are positioned in spaced apart relationship to the central first plate 100 with one of their major surfaces facing a major surface of the central first plate 100.

As noted above, plates can be prone to vibrations. Plates 100, 110, 120 are connected together using stiffener elements 130 which extend between an edge of one of the further plates 110, 120 and an edge of the central plate 100. In this example, the stiffener elements 130 extend along the entire length of the edge of the plates (i.e. they are in the form of plates), but the required stiffness is achievable even if the stiffener elements 130 only extend between corners of the plates 100, 110, 120. For example, the stiffener elements may be in the form of bars linking the plates.

As can be seen from FIG. 2, the frame 10 is manufactured from a plurality of pieces of glass ceramic. In a preferred embodiment the glass ceramic material is Zerodur™. The

TABLE 1

| Material | E, GPa | Coefficient of Thermal Expansion, $K^{-1}$ | Density, $kg/m^3$ | Emission Coefficient for Electromagnetic Radiation in Infrared Range |
|---|---|---|---|---|
| Stainless Steel | 200 | $10 \times 10^{-6}$ | 7700 | 0.1–0.2 |
| Invar ™ | 140 | $1 \times 10^{-6}$ | 8100 | 0.1–0.25 |
| ULE ™ | 70 | $0.01 \times 10^{-6}$ | 2200 | 0.8 |
| Zerodur ™ | 90 | $<0.05 \times 10^{-6}$ | 2500 | 0.8 |
| Cordierite ™ | 140 | $0.05 \times 10^{-6}$ | 2600 | 0.8 |
| Astrosital ™ | 90 | $0.03 \times 10^{-6}$ | 2500 | 0.8 |
| Clearceram-Z ™ | 90.3 | $0.03 \times 10^{-6}$ | 2550 | 0.8 | separate parts of the frame 10 may be connected by gluing, fritting (gluing at high temperature in which a glue material is placed between the pieces to be joined), fusion, and/or by using bolts. The elongation of such a frame 10 over time with respect to temperature may thus be reduced by a factor of 200 with respect to normally used types of stainless steel.

FIG. 2 also illustrates a projection system PL whose optical elements are mounted to the support portions of frame 10. The projection beam PB enters the projection system PL at the top of the frame 10 and exits at the bottom of the frame 10 as illustrated. A plurality of optical elements (M1–M6) are supported on the inside of the frame 10; these elements control (e.g. direct, reflect, pattern, and/or shape) the beam before it exits through the bottom of the frame 10. The optical elements of an EUV lithography apparatus are reflective and may be mounted to the frame 10 in a way as described in European Patent Application No. 01310781.8, incorporated herein by reference. In this example, the overall length of the frame 10 from where the projection beam PB enters to where it exits is about 1.2 to 1.4 m, and the distance from reticle to substrate is about 1.5 m.

Preferably the optical elements are mounted to the plates 100, 110, 120. Through holes 115, 135 in both the plates 100, 110, 120 and the stiffener elements 130 allow the projection beam PB to enter the frame 10 and also allow for the provision of utilities such as gas, air etc. to the positioning means of the optical elements and also for sensors and the like inside the frame 10. There may be removable access panels in the stiffener elements 130 and/or plates 100, 110, 120 to facilitate access to the optical elements.

Thus, the need for either complicated predictive temperature compensation positioning means for each optical element or for heavy, bulky and intricate cooling systems may be avoided without compromising the stability of the position of the optical elements mounted on the frame with respect to temperature fluctuations.

The frame 10 has been described with reference to supporting optical elements and may also support components of various sensors to detect the position of the optical elements. However, the invention is equally applicable to a so-called "reference frame" of the projection system which supports components of the various sensors to detect the position of the optical elements separate from the support frame of the projection system as described above.

Whilst specific embodiments of the invention have been described above, it will be appreciated that the invention as claimed may be practiced otherwise than as described. It is explicitly noted that the description of these embodiments is not intended to limit the invention as claimed.

We claim:

1. A lithographic projection apparatus configured to image a pattern onto a substrate, said apparatus comprising;
   a radiation system configured to provide a projection beam of radiation;
   a support structure configured to support a patterning structure capable of patterning the projection beam according to a desired pattern;
   a projection system configured to project the patterned beam onto a target portion of the substrate, said projection system including a plurality of optical elements configured to control the patterned beam; and
   a frame including a set of support portions, said set being configured to support the plurality of optical elements,
   wherein each support portion is made of a material having a coefficient of thermal expansion not greater than $0.1 \times 10^{-6}$ K$^{-1}$, and
   wherein at least a portion of one of a front and a back surface of one of the optical elements is mounted to one of the support portions.

2. The lithographic projection apparatus according to claim 1, wherein each support portion is made of a glass ceramic material.

3. The lithographic projection apparatus according to claim 1, wherein each support portion is made of a composition including silicon dioxide and at least one of titanium dioxide, an alkaline metal oxide, magnesium oxide, and aluminum oxide.

4. The lithographic projection apparatus according to claim 1, wherein each of the plurality of optical elements comprises a mirror.

5. The lithographic projection apparatus according to claim 1, wherein at least one support portion has the form of a plate.

6. The lithographic projection apparatus according to claim 1, wherein the set includes a plurality of support portions in the form of plates, said plates being in spaced apart relationship and arranged such that surfaces of said plates face each other, and
   wherein the frame includes at least one stiffener element, each stiffener element being attached to at least two of said plates.

7. The lithographic projection apparatus according to claim 6, wherein each optical element is attached to at least one of said plates.

8. The lithographic projection apparatus according to claim 1, wherein each optical element is independently mounted on at least one support portion.

9. The lithographic projection apparatus according to claim 1, wherein at least one support portion is made of a material that has a coefficient of thermal expansion not greater than $0.05 \times 10^{-6}$ K$^{-1}$.

10. The lithographic projection apparatus according to claim 1, wherein at least one support portion is made of a material that has a Young's Modulus (E) of at least 60 GPa.

11. A lithographic projection apparatus configured to image a pattern onto a substrate, said apparatus comprising:
    a radiation system configured to provide a projection beam of radiation;
    a substrate table configured to hold the substrate;
    a projection system configured to project a patterned beam based on the projection beam onto a target portion of the substrate, said projection system including a plurality of optical elements each configured to control a beam based on the projection beam;
    a set of sensors configured to measure a position of at least one optical element; and
    a frame including a set of support portions, said set being configured to support at least one of 1) the plurality of optical elements and 2) the set of sensors,
    wherein each support portion is made of a material having a coefficient of thermal expansion not greater than $0.1 \times 10^{-6}$ K$^{-1}$, and
    wherein at least a portion of one of a front and a back surface of one of the optical elements is mounted to one of the support portions.

12. The lithographic projection apparatus according to claim 11, wherein each support portion is made of a glass ceramic material.

13. The lithographic projection apparatus according to claim 11, wherein each support portion is made of a composition including silicon dioxide and at least one of titanium dioxide, an alkaline metal oxide, magnesium oxide, and aluminum oxide.

14. The lithographic projection apparatus according to claim 11, wherein each of the plurality of optical elements comprises a mirror.

15. The lithographic projection apparatus according to claim Ii, wherein the set includes a plurality of support portions in the form of plates, said plates being in spaced apart relationship and arranged such that surfaces of said plates face each other, and wherein the frame includes at least one stiffener element, each stiffener element being attached to at least two of said plates.

16. The lithographic projection apparatus according to claim 15, wherein each optical element is attached to at least one of said plates.

17. The lithographic projection apparatus according to claim 11, wherein each optical element is independently mounted on at least one support portion.

18. The lithographic projection apparatus according to claim 11, wherein at least one support portion is made of a material that has a coefficient of thermal expansion not greater than $0.05 \times 10^{-6} \text{ K}^{31\ 1}$.

19. The lithographic projection apparatus according to claim 11, wherein at least one support portion is made of a material that has a Young's Modulus (E) of at least 60 GPa.

20. The lithographic projection apparatus according to claim 11, wherein at least one of the optical elements is configured to pattern a beam based on the projection beam.

21. A device manufacturing method, said method comprising:

using a radiation system to provide a projection beam of radiation;

using patterning structure to endow the projection beam with a pattern in its cross-section;

using a plurality of optical elements to project the patterned beam of radiation onto a target portion of a layer of radiation-sensitive material that at least partially covers a substrate, and measuring a position of at least one optical element using a set of sensors, wherein at least one of 1) the plurality of optical elements and 2) the set of sensors are supported by a set of support portions of a frame, wherein each support portion is made of a material having a coefficient of thermal expansion not greater than $0.1 \times 10^{-6} \text{ K}_{-1}$, and wherein at least a portion of one of a front and a back surface of one of the optical elements is mounted to one of the support portions.

22. The device manufacturing method according to claim 21, wherein said using a plurality of optical elements to project the patterned beam of radiation occurs within a vacuum.

23. The device manufacturing method according to claim 21, wherein at least two of the optical elements are mounted to the support portion.

24. The device manufacturing method according to claim 21, wherein, within a volume of the support portion that is delimited by extending a perimeter of one of the front and the back surface of the optical element along an axis normal to that surface, the support portion is continuous in a plane parallel to a surface of the support portion that is within the volume.

25. The lithographic projection apparatus according to claim 1, wherein at least two of the optical elements are mounted to the support portion.

26. The lithographic projection apparatus according to claim 1, wherein, within a volume of the support portion that is delimited by extending a perimeter of one of the front and the back surface of the optical element along an axis normal to that surface, the support portion is continuous in a plane parallel to a surface of the support portion that is within the volume.

27. The lithographic projection apparatus according to claim 11, wherein at least two of the optical elements are mounted to the support portion.

28. The lithographic projection apparatus according to claim 11, wherein, within a volume of the support portion that is delimited by extending a perimeter of one of the front and the back surface of the optical element along an axis normal to that surface, the support portion is continuous in a plane parallel to a surface of the support portion that is within the volume.

* * * * *

UNITED STATES PATENT AND TRADEMARK OFFICE
CERTIFICATE OF CORRECTION

PATENT NO. : 6,750,949 B2
DATED : June 15, 2004
INVENTOR(S) : Erik Roelof Loopstra et al.

It is certified that error appears in the above-identified patent and that said Letters Patent is hereby corrected as shown below:

Title page,
Item [73], Assignee, replace "AMSL Netherlands V.V., Veldhoven (NL)" with
-- AMSL Netherlands V.V., Veldhoven (NL)
  Carl Zeiss SMT AG, Oberkochen, (DE) --.

Signed and Sealed this

Fifth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,750,949 B2  
APPLICATION NO. : 10/193688  
DATED : June 15, 2004  
INVENTOR(S) : Erik Roelof Loopstra et al.

It is certified that error appears in the above-identified patent and that said Letters Patent is hereby corrected as shown below:

On title page, item 73 Assignee(s)  
replace "AMSL Netherlands V.V., Veldhoven (NL)  
     Carl Zeiss SMT AG, Oberkochen (DE)"

with -- ASML Netherlands B.V., Veldhoven (NL)  
     Carl Zeiss SMT AG, Oberkochen (DE) --

Signed and Sealed this

Fifteenth Day of April, 2008

JON W. DUDAS  
*Director of the United States Patent and Trademark Office*